United States Patent [19]

Chinen

[11] Patent Number: 5,281,829
[45] Date of Patent: Jan. 25, 1994

[54] OPTICAL SEMICONDUCTOR DEVICE HAVING SEMICONDUCTOR LASER AND PHOTODETECTOR

[75] Inventor: Koyu Chinen, Yokohama, Japan

[73] Assignee: Kabushiki Kaisha Toshiba, Kawasaki, Japan

[21] Appl. No.: 944,085

[22] Filed: Sep. 11, 1992

[30] Foreign Application Priority Data

Sep. 12, 1991 [JP] Japan .................................. 3-260487

[51] Int. Cl.$^5$ .................... H01L 33/00; H01L 31/12; H01L 31/16
[52] U.S. Cl. ........................................ 257/80; 257/98; 257/79; 257/432; 257/466
[58] Field of Search ................ 257/98, 80, 466, 432; 437/38

[56] References Cited

U.S. PATENT DOCUMENTS

| | | | |
|---|---|---|---|
| 4,366,492 | 12/1982 | Kitamura | 346/160 |
| 4,794,609 | 12/1988 | Hara et al. | 372/50 |

FOREIGN PATENT DOCUMENTS

| | | |
|---|---|---|
| 0080945 | 6/1983 | European Pat. Off. . |
| 58-31593 | 2/1983 | Japan . |
| 61-183988 | 8/1986 | Japan . |
| 62-145791 | 6/1987 | Japan . |
| 62-150795 | 7/1987 | Japan . |
| 63-60563 | 3/1988 | Japan . |
| 2120457A | 11/1983 | United Kingdom . |

*Primary Examiner*—Andrew J. James
*Assistant Examiner*—T. M. Arroyo
*Attorney, Agent, or Firm*—Finnegan, Henderson, Farabow, Garrett & Dunner

[57] ABSTRACT

An optical semiconductor device includes a semiconductor laser buried with a current blocking layer, and a photodetector, such as a phototransistor, which are provided on a semiconductor substrate. In such a device, the photodetector has the same thickness and composition as those of the current blocking layer, and a groove is provided in the semiconductor substrate to define an emitting end surface of the semiconductor laser and a light detection surface of the photodetector opposed to each other.

12 Claims, 4 Drawing Sheets

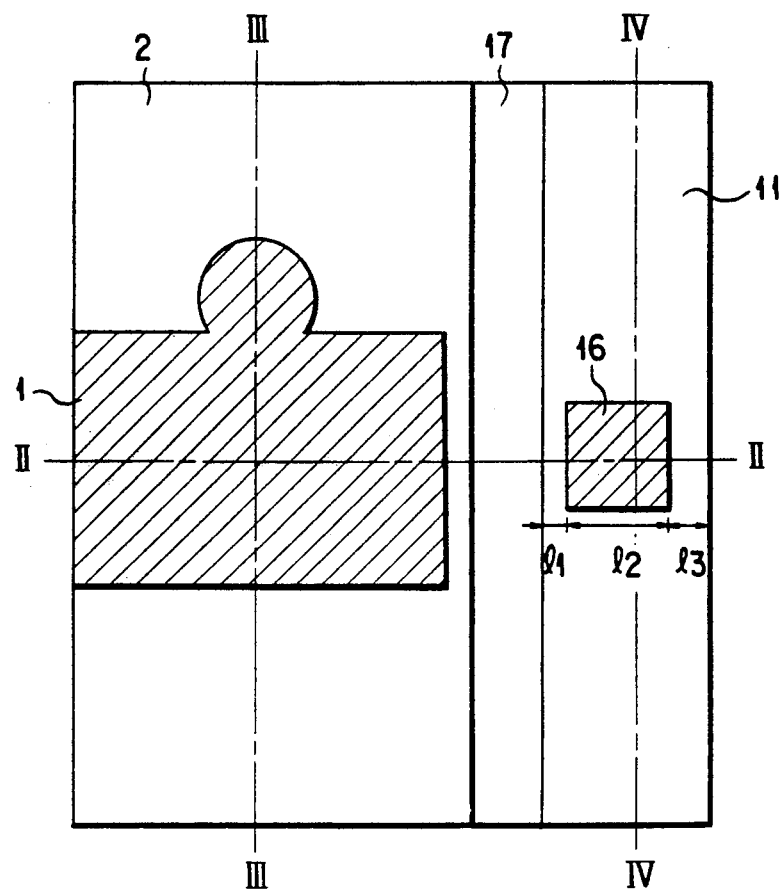
F I G. 1
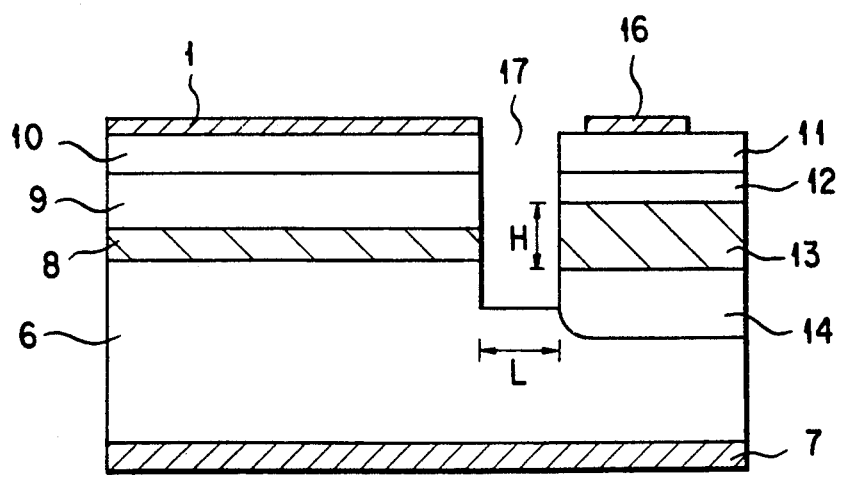
F I G. 2

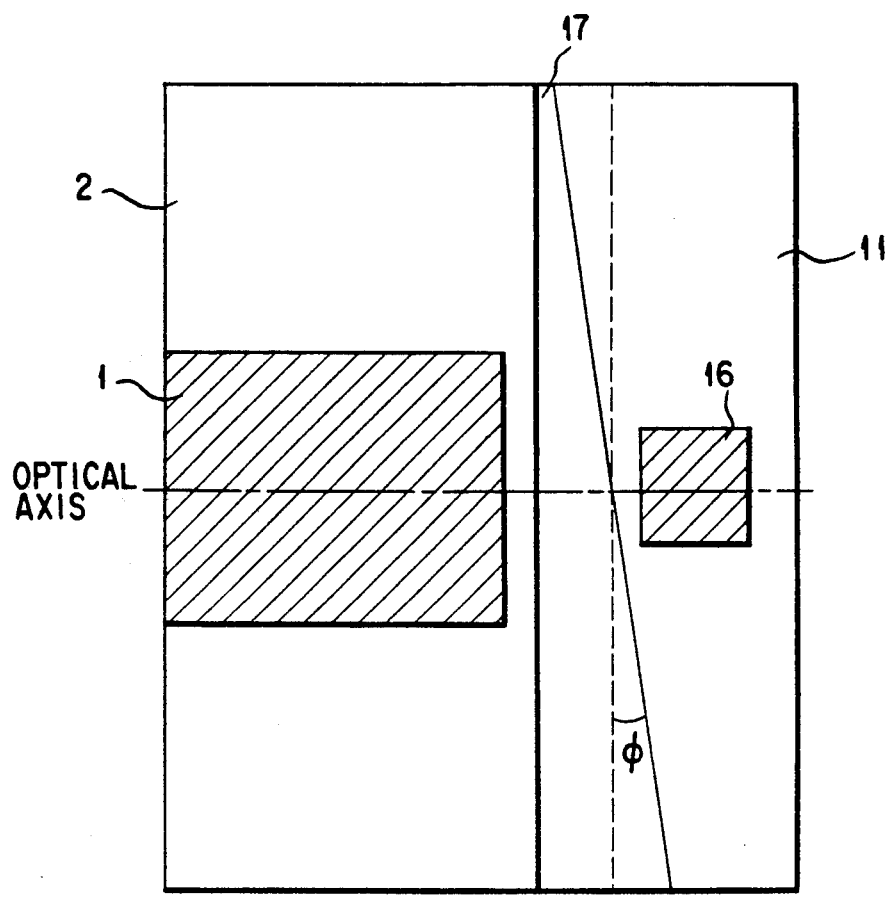
F I G. 5
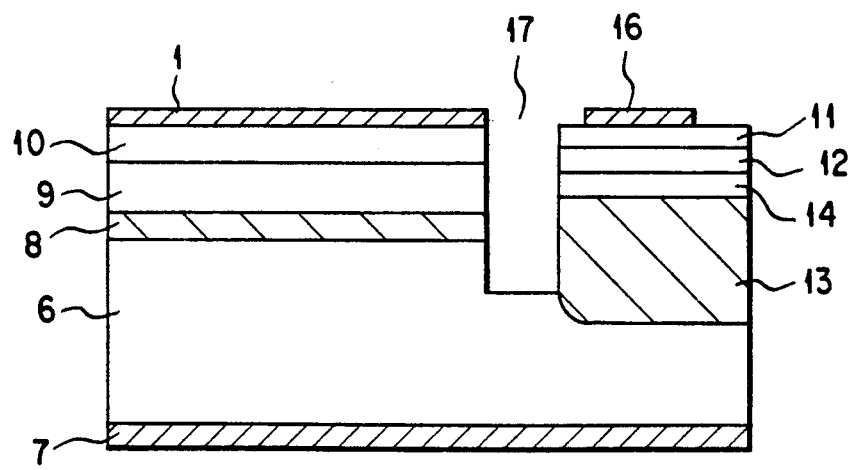
F I G. 6

5,281,829

OPTICAL SEMICONDUCTOR DEVICE HAVING SEMICONDUCTOR LASER AND PHOTODETECTOR

BACKGROUND OF THE INVENTION

1. Field of the Invention

The present invention relates to an integrated optical semiconductor device used in optical fiber communication or optical information processing.

2. Description of the Related Art

In optical fiber communication or optical information processing, a light source such as a semiconductor laser has been generally used. However, in order to establish a desired information system, the phase and frequency of light emitted from the semiconductor laser must be controlled with high precision. For this reason, an optical circuit is formed on a substrate by an optical waveguide, or an optical signal must be processed, or a semiconductor optical waveguide and a photodetector must be integrated. In addition, it has been known that a photodiode is arranged at a position opposite to the radiation direction of the semiconductor laser to control or monitor the operation of the semiconductor laser. In a conventional technique, a semiconductor laser and a photodiode are independently provided, and they are fixed on a base to be opposed to each other.

In recent years, an optical semiconductor device integrated by forming a laser diode and a photodiode on the same semiconductor substrate has been proposed to obtain the most advanced functions, mass-production, and low cost. The integrated optical semiconductor device, as shown in FIG. 9, includes a semiconductor laser and a photodiode formed on an insulating semiconductor substrate 25. The semiconductor laser consists of an n-type InP clad layer 24, an InGaAsP active layer 23, a p-type InP clad layer 22, a p-type InGaAsP contact layer 21, a p-side electrode 20, and an n-side electrode 26, and the photodiode consists of an InGaAsP layer 30 serving as an light absorption layer, an n-type InP layer 31, a p-type InP layer 29, a p-type InGaAsP contact layer 28, an n-side electrode 32, and a p-side electrode 27. Since this photodiode is formed in the same process as that of the semiconductor laser, the composition of the photodiode is the same as that of the semiconductor laser. A positive potential and a negative potential are applied to the n-side electrode 32 and the p-side electrode 27 in the photodiode, respectively. For operating the semiconductor laser, a positive potential and a negative potential are applied to the p-side electrode 20 and the n-side electrode 26, respectively, to inject carriers to the active layer 23. The semiconductor laser and the photodiode are separated from each other by a groove 33 formed by a dry etching technique such as RIE. The photodiode serving as a photodetector, as described above, is made as follows. That is, the semiconductor layers for providing the semiconductor laser are formed on the semiconductor substrate 25 and etched down to the substrate 25 to form the groove 33. A part of the semiconductor layers separated by the groove 33 is then used as the photodiode. The photodiode, therefore, has the same structure as that of the semiconductor laser. In the semiconductor laser, the multilayer film including the active layer 23 and the clad layers is formed to provide a stripe-shaped structure, and a current blocking layer is grown on the substrate at both sides of the stripe-shaped structure in parellel with an optical axis. In order to provide the current blocking layer, after the multilayer film is provided, the stripe-shaped active region and the surface of the photodiode are covered with an insulating film such as an $SiO_2$ film or an $Si_3N_4$ film. Thereafter, the multilayer film is selectively removed to expose the substrate 25. Semiconductor layers are grown on the exposed semiconductor substrate 25 to form a current blocking layer. Finally, the electrodes are provided to complete the integrated semiconductor device. However, with the above arrangement, since the absorption layer 30 of the photodiode has the same composition as that of the active layer 23 of the semiconductor laser, it has a small absorption coefficient of the laser beam, and the photodiode having a desired sensitivity cannot be obtained. In addition, since the thickness of the absorption layer 30 has the same thickness as that of the active layer 23, and is thin i.e., about 0.1 μm, it cannot sufficiently receive the laser beam emitted from the semiconductor laser. Furthermore, since the insulating substrate 25 is used, the electrodes cannot easily provided because they must be separately provided for elements on the substrate. Therefore, with the above arrangement, an optical semiconductor device having the most advanced functions, mass production, low cost cannot be obtained.

SUMMARY OF THE INVENTION

It is, therefore, an object of the present invention to provide an improved optical semiconductor device including a semiconductor laser and a phototransistor which are integrated without using an insulating substrate.

It is another object of the present invention to provide an optical semiconductor device including a phototransistor having an improved light detection performance.

It is still another object of the present invention to provide an integrated optical semiconductor device capable of providing a current blocking layer of a semiconductor laser and a phototransistor on the same substrate by the same process.

According to an aspect of the present invention, there is provided an optical semiconductor device, which comprises a semiconductor substrate, a semiconductor laser, provided on the semiconductor substrate, including a stripe-shaped structure having an active layer, a current blocking layer provided on the semiconductor substrate so as to bury the semiconductor laser, a photodetector, provided on the semiconductor substrate, having the same thickness and composition as those of the current blocking layer, and a groove provided in the semiconductor substrate to define an emitting end surface of the semiconductor laser and a light detection surface of the photodetector opposed to each other.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 1 is a plan view showing an optical semiconductor device according to a first embodiment of the present invention;

FIG. 2 is a sectional view showing the optical semiconductor device taken along a line II—II in FIG. 1;

FIG. 5 is a plan view showing an optical semiconductor device according to a second embodiment of a present invention;

FIG. 6 is a sectional view showing an optical semiconductor device according to a third embodiment of the present invention;

DETAILED DESCRIPTION OF THE PREFERRED EMBODIMENTS

Figure 3:
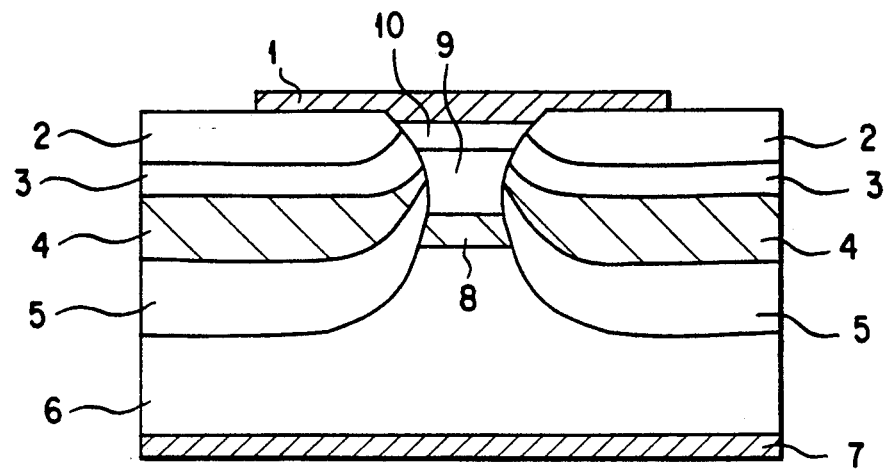
FIG. 3 is a sectional view showing the optical semiconductor device taken along a line III—III in FIG. 1.

Embodiments of the present invention will be described below with reference to the accompanying drawings.

Note that the same reference numerals denote the same parts in all drawings.

The first embodiment will be described below with reference to FIGS. 1 to 4. FIG. 1 is a plan view showing an integrated optical semiconductor device. In the integrated optical semiconductor device, a stripe-shaped semiconductor laser is provided under a p-side electrode 1, and a current blocking layer having a contact layer 2 is provided at both sides of the semiconductor laser. The electrode 1 has a projected portion used for bonding. The width of the electrode is about 10 μm to 30 μm. This width can also be set to be about 200 μm to 300 μm. A phototransistor (photodetector) is provided so as to be opposed to the stripe-shaped semiconductor laser and the current blocking layer through a groove 17. In FIG. 1, an n-side electrode 16 of the phototransistor and a contact layer 11 of the n-side electrode 16 are shown. FIG. 2 shows a sectional view taken along a line II—II of FIG. 1. The semiconductor laser provided on one major surface of a semiconductor substrate 6 includes an active layer 8, a clad layer 9, and a contact layer 10 successively disposed from the lower portion, and the electrode 1 is in contact with the contact layer 10. On the contrary, the phototransistor includes a p-type InP layer 14, a light absorption layer 13, an n-type InP layer 12, the contact layer 11, and the electrode 16 successively located from the lower portion. A common electrode 7 for the semiconductor laser and the phototransistor is provided on the other major surface of the semiconductor substrate 6. The distance between the electrode 7 and the electrode 1, i.e., the thickness of the optical semiconductor device, is about 100 μm. The thickness of the semiconductor laser provided on the semiconductor substrate 6 is about 4 to 5 μm, and the thickness of the phototransistor is 5 to 6 μm. The thickness of the active layer 8 of the semiconductor laser is about 0.1 μm, and the thickness of the light absorption layer 13 of the phototransistor is about 2 to 3 μm in the embodiment. Since the common electrode 7 is formed on the substrate 6, the manufacturing steps of the optical semiconductor device become easy as compared with those of the conventional optical semiconductor device in which electrodes are separately provided to every elements. The current blocking layer and the photodetector in the first embodiment are provided by a multilayer semiconductor film having the same structure, and the multilayer semiconductor film has a p-i-n structure. This structure does not include the contact layer of the electrode.

FIG. 3 shows a sectional view taken a line III—III of FIG. 1. The current blocking layer consists of the same multilayer semiconductor film as to that of the phototransistor, and the current blocking layer has a high-resistance i-type InGaAsP layer 4. Although a light component spontaneously emitted from the active layer leaks to the blocking layer, the amount of the light component is very small, and the light component is reflected by the p type InP layer of the current blocking layer. For this reason, the absorption of the light component in the i-type layer can be neglected. The current blocking layer is provided by a multilayer film that includes a p-type InP layer 5, the i-type InGaAsP layer 4, an n-type InP layer 3, and the n-type InGaAsP contact layer 2. On the contrary, the semiconductor laser is provided by the nondoped InGaAsP active layer 8, the p-type InP clad layer 9, and the p-type InGaAsP contact layer 10 on which the Au-Zn electrode 1 is provided. The width of the active layer 8 is 1 to 1.5 μm, and the width of the electrode is 20 to 30 μm.

Figure 4:
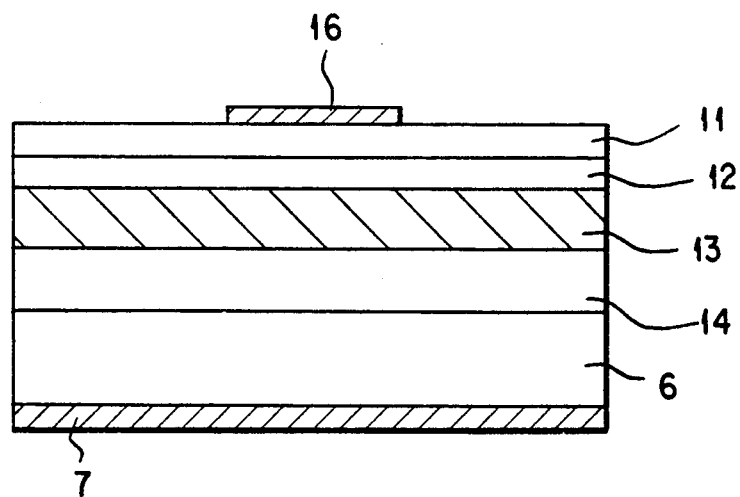
FIG. 4 is a sectional view showing the optical semiconductor device taken along a line IV—IV in FIG. 1.

FIG. 4 shows a sectional view taken along a line IV—IV of FIG. 1. The phototransistor is obtained by forming the p-type InP layer 14, the i-type InGaAsP light absorption layer 13, the n-type InP layer 12, and the n-type InGaAsP contact layer 11 on the n-type InP substrate 6 having the n-side electrode 7, and the electrode 16 is formed on the contact layer 11. The semiconductor laser is separated from the phototransistor by the groove 17 formed by dry etching such as RIE. Since the optical semiconductor device including the semiconductor laser described above can be formed by the same process as that of a conventional buried semiconductor laser, it can be mass-produced. In addition, since the phototransistor has the photosensitivity of several tens to several hundreds times as compared to a photodiode, functions of monitoring and controlling the semiconductor laser can be greatly improved. The electrodes can be formed by a simple process, and the device structure is not complicated, thereby improving workability of wire bonding and the like.

A method of making the optical semiconductor device will be described below. The n-type InP substrate 6 is used as a semiconductor substrate. The nondoped InGaAsP active layer 8, the p-type clad layer 9, and the p-type InGaAs contact layer 10 are sequentially grown on the entire surface of the n-type InP substrate 6 to provide a multilayer film. Thereafter, an insulating film (not shown) such as an SiO₂ film and an Si₃N₄ film is formed on the surface of the multilayer film. In this case, the surface of the multilayer film is covered with the insulating film in such a manner that the width of the active layer 8 of the semiconductor laser becomes about 1 to 1.5 μm. Thereafter, the multilayer film, which is not covered with the insulating film, is selectively etched by chemical etching to provide the stripe-shaped semiconductor laser. At this time, since the surface of the substrate is also etched, the thickness of the peripheral portion thereof is decreased. Thereafter, the p-type InP layer, the i-type InGaAsP layer, the n-type InP layer, and the n-type InGaAsp layer are sequentially grown on the chemically etched substrate surface to provide the current blocking layer and the phototransistor. The groove 17 is formed by dry etching such as RIE to separate the current blocking layer from the phototransistor. By the above steps, the current blocking layer, consisting of the p-type InP layer 5, the i-type InGaAsP layer 4, the n-type InP layer 3 and the n-type InGaAsP layer 2, and the phototransistor, consisting of the p-type InP layer 14, the i-type InGaAsP layer 13, the n-type InP layer 12 and the n-type InGaAs layer 11, are provided at the same time. After the insulating film 5 is removed from the semiconductor laser, the electrode 1 consisting of e.g., Au-Zn is formed on the p-type InGaAsP contact layer 10 of the semiconductor laser by electron beam evaporation techniques or sputtering techniques, and the electrode 16 consisting of, e.g., Au-Ge, is formed on the n-type InGaAsP contact layer 11 by the sputtering. Finally, the electrode 7 consisting of, e.g., Au-Ge, is formed on the opposite surface of the substrate.

In the first embodiment, the InP semiconductor substrate is employed, and the InGaAsP semiconductor is used for the i-type layer. However, the present invention is not limited to these materials. For example, a GaAs semiconductor substrate can be used. In this case, GaAℓAs, InGaAℓP, or GaAℓP semiconductors can be used as the i-type layer.

In general, oscillation light emitted from a semiconductor laser has an energy somewhat lower than that of the band gap energy. When the light absorption layer 13 for receiving the light is composed of a composition of $In_xGa_{1-x}As_yP_{1-y}$, the band gap can be easily changed by varying the composition ratio. Therefore, when the composition ratio y of the light absorption layer 13 is controlled within a range of 0 to 1 to have an energy gap lower than that of the active layer 8 of the semiconductor laser, the absorption sensitivity of the phototransistor can be increased. In order to obtain the light absorption layer 13 having a band gap energy lower than that of the oscillation light emitted from the semiconductor laser, the composition ratio y of the light absorption layer 13 may be made higher than that of the active layer 8. In this embodiment, since the oscillation wavelength is 1.3 μm, the composition ratio y of the light absorption layer is controlled within a range of 0.55 to 0.8. As the composition ratio y is increased, the absorption coefficient is increased, but a degree of the light absorption layer 13 which contributes to a photocurrent is decreased due to an increase in absorption and recombination at the end surface of the light absorption layer 13 of the phototransistor. Therefore, the composition ratio y of the light absorption layer 13 is given by 0.8 or less so that a light transmission length becomes about 50 μm to 500 μm. In addition, since the light absorption layer 13 must have a high resistance so that a sufficient electric field is applied thereto, the carrier concentration of the light absorption layer 13 is controlled to about $2 \times 10^{16}$ cm$^{-3}$ or less. The light absorption layer 13 has a light detection surface for receiving light from the semiconductor laser, and the light detection surface is opposed to the active layer of the semiconductor laser, i.e., the i-type layer 8, through the groove 17. A thickness H of the light absorption layer 13 depends on the radiation angle of laser beam and the width of the groove 17, and the thickness H can be expressed by $H = L\tan(\theta/2)$. In this case, L represents the width of the groove 17, and $\theta$ represents a radiation angle when the intensity of the oscillation light emitted from the semiconductor laser is a half value. Since about 60 to 70% of light emitted from the active layer 8 can be received by the light detection surface at a radiation angle of about ±40 degrees, the thickness of the light absorption layer 13 is preferably given by about 0.1 to 5.0 μm if the light detection surface receives the light within this range. Therefore, the light reception sensitivity of the phototransistor can be increased to ten times that of a conventional phototransistor. In addition, generation of a dark current can be reduced by rendering an upper limit to the band gap energy. In the first embodiment, although the wavelength is given by 1.3 μm, 1.55 μm or other wavelength values may be used.

In addition, although a reverse bias voltage is applied to the phototransistor, a dark current of, e.g., several μA, is generated by a leakage current even if no optical signal is applied, thereby reducing the S/N ratio. In the first embodiment, the leakage current at the end surface of the phototransistor is comparatively large. Therefore, in order to decrease the applied voltage in the end surface, one edge of the n-side electrode 16 is spaced apart from one edge of the phototransistor to satisfy a condition of $\iota_3 \geq \iota_1$. That is, as shown in FIG. 1, the distance $\iota_3$ between the edge of the phototransistor and the edge of the n-side electrode 16 is longer than the distance $\iota_1$ between the other edge of the phototransistor opposed to the groove 17 and the other edge of the n side electrode 16. This arrangement is provided because the amount of light absorption is increased at the end surface of the phototransistor opposed to the $\iota_1$ side. Therefore, a dark current generated by the phototransistor can be greatly decreased to, e.g., about several tens nA or less.

The second embodiment of the present invention will be described below with reference to FIG. 5. The figure is a plan view showing an optical semiconductor device. A stripe-shaped active layer of a semiconductor laser for generating a laser beam is provided under the electrode 1 in parallel therewith. Therefore, the laser beam is emitted in the direction of a photodetector along an optical axis (shown in FIG. 5) that is in parallel with the electrode 1. However, when the laser beam is perpendicularly incident to the photodetector, i.e., when the optical axis is perpendicular to the photodetector, the incident laser beam is reflected to increase the reflection rate returned to the laser active layer. Therefore, in order to reduce the return luminous energy, the laser beam is inclined at ω degrees in the embodiment. The most efficient angle φ for minimizing the return luminous energy is about 5 to 20 degrees.

The third embodiment of the present invention will be described below with reference to FIG. 6. A semiconductor laser of the embodiment has the same structure as that of the first embodiment (FIG. 2). A photodetector of the third embodiment has an n-i-p-n structure, unlike the photodetector of the first embodiment. The multilayer semiconductor film of the n-i-p-n structure consists of an i-type InGaAsP light absorption layer 13, a p-type InP layer 14, an n-type InP layer 12, and an n-type InGaAsP contact layer 11, on which an electrode 16 is provided. The structure is the same as that of the current blocking layer shown in the first and second embodiments. An active layer 8 is opposed to the light absorption layer 13 through a groove 17, and the light absorption efficiency of the light absorption layer 13 is equal to those of the first and second embodiments.

Figure 7:
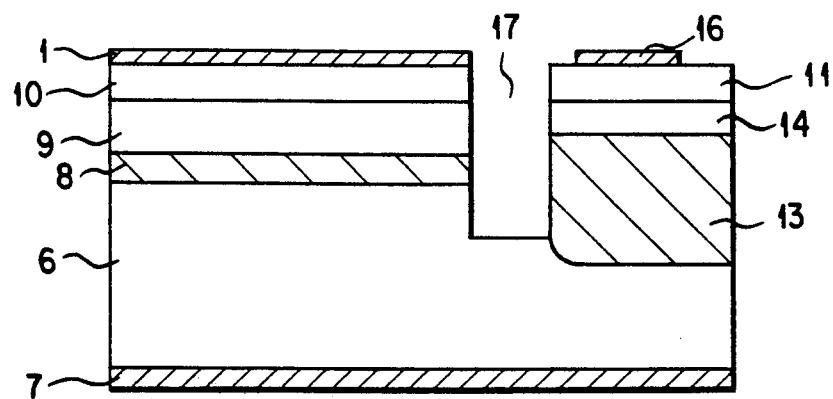
FIGS. 7 and 8 are sectional views showing an optical semiconductor device according to a fourth embodiment of the present invention.
Figure 8:
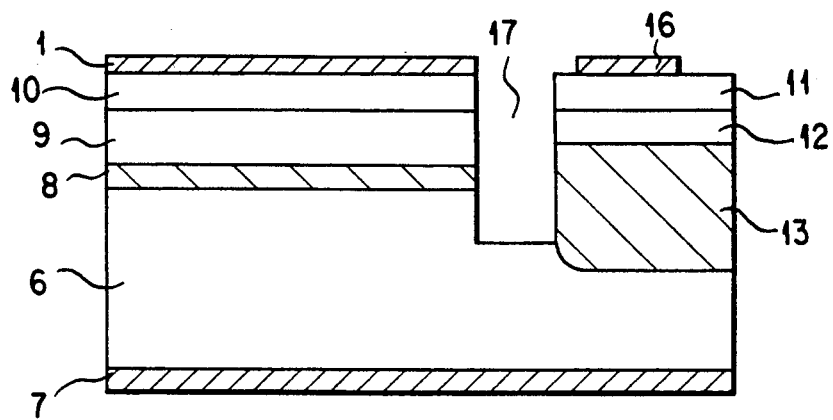
Figure 9:
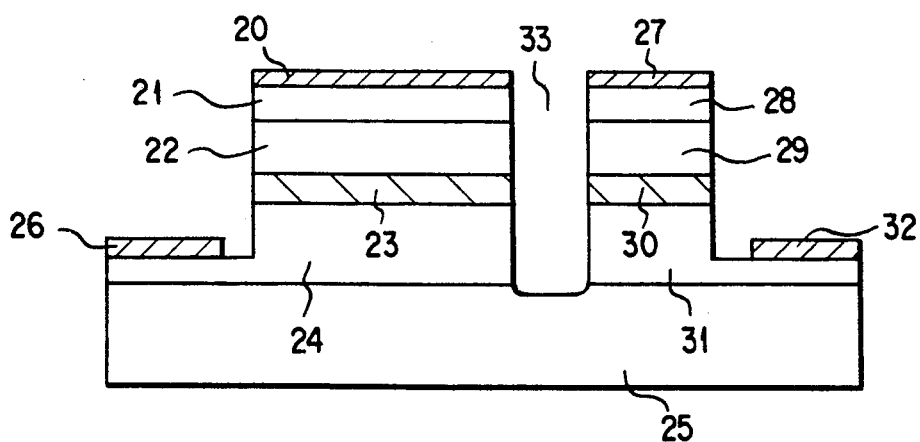
FIG. 9 is a sectional view showing a conventional optical semiconductor device.

The fourth embodiment of the present invention will be described below with reference to FIGS. 7 and 8. The structures of semiconductor lasers in FIGS. 7 and 8 are the same as that of the first embodiment (FIG. 2). A photodetector in FIG. 7 has an n-i-p structure unlike the photodetector in FIG. 2. The multilayer semiconductor film of the n-i-p structure consists of an i-type InGaAsP light absorption layer 13, a p-type InP layer 14, and a p-type InGaAsP contact layer 11 on which an electrode 16 is provided. The structure is the same as that of the current blocking layer shown in the first, second and third embodiments. An active layer 8 is opposed to the light absorption layer 13 through a groove 17, and the light absorption efficiency of the light absorption layer 13 is equal to those of the first, second, and third embodiments. In the fourth embodiment, since a voltage is applied to the photodetecor in a forward direction, a current flows easily. However, since the i-type layer has a high resistance, it may be preferable to apply a low voltage to the photodector. A structure in FIG. 8 is almost the same as that of FIG. 7. That is, a photodetector in FIG. 8 has an n-i-n structure. The multilayer semiconductor film of the n-i-n structure consists of an i-type InGaAsP light absorption layer 13, an n-type InP layer 12, and an n-type InGaAsP contact layer 11, and an electrode 16 is provided on the contact layer. This structure is the same as that of the current blocking layer shown in the first, second and third embodiments.

As described above, in the optical semiconductor device according to the present invention, since the photodetector having the same structure as that of current blocking layer is provided on the same substrate, it is not necessary to use a complicated manufacturing process, and the light absorbing efficiency of the photodetector can be greatly improved. In addition, since the semiconductor laser and the photodetector can be simultaneously formed on the substrate, the optical semiconductor device can be excellently manufactured.

It is further understood by those skilled in the art that the foregoing description is only of the preferred embodiments and that various changes and modifications may be made in the invention without departing from the spirit and scope thereof.

What is claimed is:

1. An optical semiconductor device comprising:
   a semiconductor substrate;
   a semiconductor laser, provided on said semiconductor substrate, including an active layer and an emitting end surface;
   a current blocking layer provided on said semiconductor substrate so as to be disposed at longitudinal sides of said semiconductor laser;
   a photodetector, provided on said semiconductor substrate, including a light detection surface and a light absorption layer thicker than said active layer; and
   a groove provided between said semiconductor laser and said photodetector to optically couple said emitting end surface with said light detection surface.

2. The optical semiconductor device according to claim 1, wherein said photodetector has the same thickness and composition as that of said current blocking layer.

3. The optical semiconductor device according to claim 1, wherein said emitting end surface is opposed to said light detection surface within said groove.

4. The optical semiconductor device according to claim 1, wherein said active layer is opposed to said light absorption layer.

5. The optical semiconductor device according to claim 1, wherein said groove reaches said semiconductor substrate.

6. The optical semiconductor device according to claim 1, wherein a first positive electrode is provided on said semiconductor laser, while a second positive electrode is disposed on said photodetector.

7. The optical semiconductor device according to claim 1, wherein a negative electrode is provided on said semiconductor substrate as a common electrode.

8. The optical semiconductor device according to claim 1, wherein a thickness of said light absorption layer is determined by a width of said groove and a radiation angle of a laser beam emitted from said semiconductor laser.

9. The optical semiconductor device according to claim 6, wherein said first positive electrode and said second positive electrode are arranged such that a center line of said first and second positive electrodes corresponds to an optical axis.

10. The optical semiconductor device according to claim 6, wherein a first distance between said light detection surface and one side of said second positive electrode is shorter than a second distance between an end surface of said photodetector and an opposite side of said second positive electrode.

11. The optical semiconductor device according to claim 1, wherein said light detection surface of said photodetector is inclined at an angle of 5 to 20 degrees with respect to said emitting end surface.

12. The optical semiconductor device according to claim 1, wherein said current blocking layer and said photodetector have a structure selected from n-p-i-n, n-i-p-n, n-i-p and n-i-n structures, respectively.

* * * * *